(12) United States Patent
Hsiao

(10) Patent No.: US 7,729,183 B2
(45) Date of Patent: Jun. 1, 2010

(54) DATA SENSING METHOD FOR DYNAMIC RANDOM ACCESS MEMORY

(75) Inventor: Ling Wen Hsiao, Hsinchu (TW)

(73) Assignee: Promos Technologies Inc., Hsinchu (TW)

( * ) Notice: Subject to any disclaimer, the term of this patent is extended or adjusted under 35 U.S.C. 154(b) by 112 days.

(21) Appl. No.: 12/147,012

(22) Filed: Jun. 26, 2008

(65) Prior Publication Data

US 2009/0323433 A1 Dec. 31, 2009

(51) Int. Cl.
*G11C 7/00* (2006.01)
(52) U.S. Cl. .................... 365/189.2; 365/205
(58) Field of Classification Search ........... 365/189.2, 365/205
See application file for complete search history.

(56) References Cited

U.S. PATENT DOCUMENTS 4,575,819 A * 3/1986 Amin .................... 365/104
5,421,000 A * 5/1995 Fortino et al. ............. 711/118
5,566,121 A * 10/1996 Hadderman et al. ....... 365/222

* cited by examiner

*Primary Examiner*—Michael T Tran
(74) *Attorney, Agent, or Firm*—WPAT, P.C.; Anthony King

(57) ABSTRACT

A data sensing method for a dynamic random access memory including a storage capacitor configured to store data, a bit line, a transistor connecting the storage capacitor and the bit line, a reference bit line, and a sense amplifier connecting the bit line and the reference bit line. The data sensing method comprises the steps of turning off the transistor when the stored data is a predetermined value before enabling the sense amplifier to sense the voltage of the bit line and the reference bit line, and turning on the transistor when the stored data is opposite to the predetermined value such that a charge sharing process occurs between the storage capacitor and a parasitic capacitor of the bit line before enabling the sense amplifier to sense the voltage of the bit line and the reference bit line.

20 Claims, 12 Drawing Sheets

DATA SENSING METHOD FOR DYNAMIC RANDOM ACCESS MEMORY

BACKGROUND OF THE INVENTION (A) Field of the Invention

The present invention relates to a data sensing method for dynamic random access memory (DRAM), and more particularly, to a data sensing method that improves the sensing margin for DRAM.

(B) Description of the Related Art

While a static random access memory (SRAM) cell needs six transistors for storing one bit, a DRAM cell needs only one transistor and one capacitor for achieving the same, and therefore both the chip size and cost are reduced when utilizing a DRAM for storage purposes. On the other hand, because the charges stored in the capacitor of the DRAM cell will leak over time, a periodic refresh operation is required to assure the correctness of the stored data.

FIG. 1 illustrates a schematic view of a memory cell 10 of a DRAM according to the prior art. The memory cell 10 comprises a transistor 20 (e.g. an NMOS transistor) and a storage capacitor 30 configured to store one bit of data. The capacitor 30 comprises an upper plate (first node) 32 and a lower plate (second node) 34 connected to a cell plate 26. One terminal of the transistor 20 is connected to a bit line 14 through a node 22, and the other terminal of the transistor 20 is connected to the upper plate 32 of the capacitor 30 through a storage node 24. A voltage applied to a word line 12 of the transistor 20 controls the turn-on and turn-off of the transistor 20.

The voltage of the lower plate 34 of the capacitor 30 is one-half of a supply voltage Vcc, i.e., Vcc/2. When the stored data is 1, the voltage at the storage node 24 is Vcc. When the stored data is 0, the voltage at the storage node 24 is 0. When the memory cell 10 is to be read or refreshed, the voltage at the bit line 14 is then pre-charged to Vcc/2. Subsequently, the voltage at the word line 12 is raised to a high voltage to turn on the transistor 20 such that a charge sharing process occurs between the capacitor 30 and the parasitic capacitor 40 of the bit line 14.

If the stored data is 1, the charge sharing process will cause the voltage of the bit line 14 to be greater than Vcc/2; otherwise, the voltage of the bit line 14 will be smaller than Vcc/2. A sense amplifier 16 connected to the bit line 14 senses the voltages of the bit line 14 and a reference bit line 14' to determine the stored data, which is then rewritten into the memory cell 10 such that the data is refreshed.

The amount of voltage difference Vs of the bit line 14 after the charge sharing process can be represented as:

$$Vs = \frac{1}{2} \frac{Vcc}{\left(1 + \frac{Cb}{Cs}\right)}$$

wherein Cb denotes the amount of charges stored on the parasitic capacitor 40, and Cs denotes the amount of charges stored on the storage capacitor 30. In other words, as the storage capacitor 30 stores more charges, the voltage difference Vs increases. For the memory cell 10 to operate normally, the voltage difference Vs is required to be larger than the minimum sense voltage of the sense amplifier 16.

More specifically, the transistor 20 will be turned on regardless of the data, 1 or 0, stored on the capacitor 30. Conventional data sensing method for DRAM divides the sensing margin equally between these two states. Practically, however, the sensing margin is decreased owing to the variation of the voltage difference Vs caused by coupling noise, offset noise and the leakage of the capacitor 30. Particularly, as modern electronic devices place more emphasis on low power consumption, the supply voltage Vcc continues to become lower such that the sensing margin of conventional data sensing method for DRAM continues to decrease, and the error percentage thereof is growing accordingly.

Therefore, there is a need to design a mechanism to enhance the sensing margin of modern DRAMs under low supply voltage such that when accessed, the error percentage thereof can be stabilized or even reduced.

SUMMARY OF THE INVENTION

The present invention provides a data sensing method for DRAM such that the sensing margin is increased and therefore can be applied to a DRAM under low supply voltage.

One embodiment of the present invention provides a data sensing method for DRAM comprising a storage capacitor configured to store data, a bit line, a transistor connecting the storage capacitor and the bit line, a reference bit line, and a sense amplifier connected to the bit line and the reference bit line. The data sensing method comprises keeping the transistor in the off state and enabling the sense amplifier to sense the voltage of the bit line and the reference bit line when the stored data is a predetermined value, and turning on the transistor when the stored data is opposite to the predetermined value such that a charge sharing process occurs between the storage capacitor and a parasitic capacitor of the bit line and enabling the sense amplifier to sense the voltage of the bit line and the reference bit line.

Another embodiment of the present invention provides a data sensing method for DRAM comprising a storage capacitor, a transistor connected to one terminal of the storage capacitor, a word line configured to control the transistor, a bit line connected to the transistor, and a cell plate connected to another terminal of the storage capacitor. The data sensing method comprises the steps of lowering the voltage of the cell plate to a first voltage and lowering the voltage of the word line correspondingly to keep the transistor in the off state, raising the voltage of the bit line to a second voltage, and raising the voltage of the word line to a third voltage and enabling a sense amplifier connecting to the DRAM, wherein the third voltage does not turn on the transistor if the voltage of the storage capacitor is in a high-level state.

The foregoing has outlined rather broadly the features and technical advantages of the present invention in order that the detailed description of the invention that follows may be better understood. Additional features and advantages of the invention will be described hereinafter, which form the subject of the claims of the invention.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
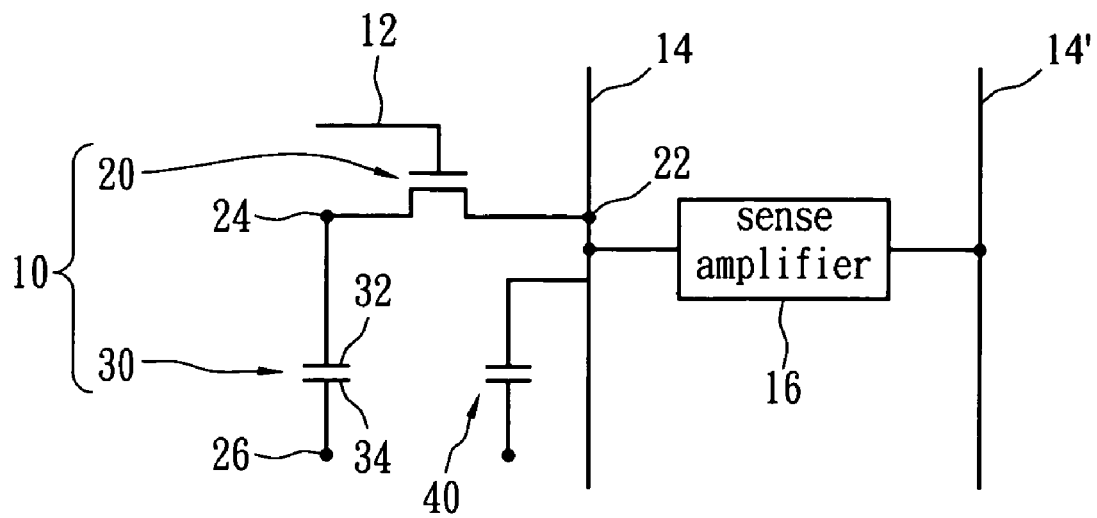
FIG. 1 illustrates a schematic view of a memory cell of DRAM according to the prior art.
Figure 2:
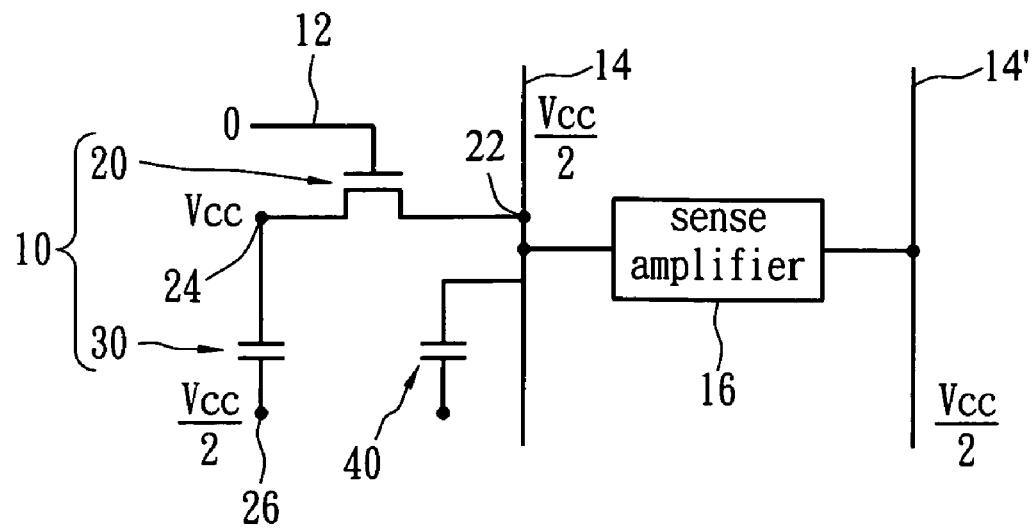
FIG. 2 to FIG. 5 illustrate a data sensing method for DRAM according to one embodiment of the present invention.

FIG. 2 to FIG. 5 illustrate a data sensing method for a DRAM according to one embodiment of the present invention. The data stored on the memory cell 10 is 1. The voltage at the storage node 24 is the supply voltage Vcc, that is, the storage capacitor 30 is in the charging state, and the voltage at the storage node 24 is in the high-level state. As shown in FIG. 2, when the memory cell 10 is ready to be read, the voltage of the bit line 14 and the cell plate 26 are kept at Vcc/2, i.e., half of the supply voltage of the DRAM, while the voltage of the word line 12 is zero. Because the voltage of the word line 12 is lower than that of the storage node 24, the transistor 20 is in the off state.

Figure 3:
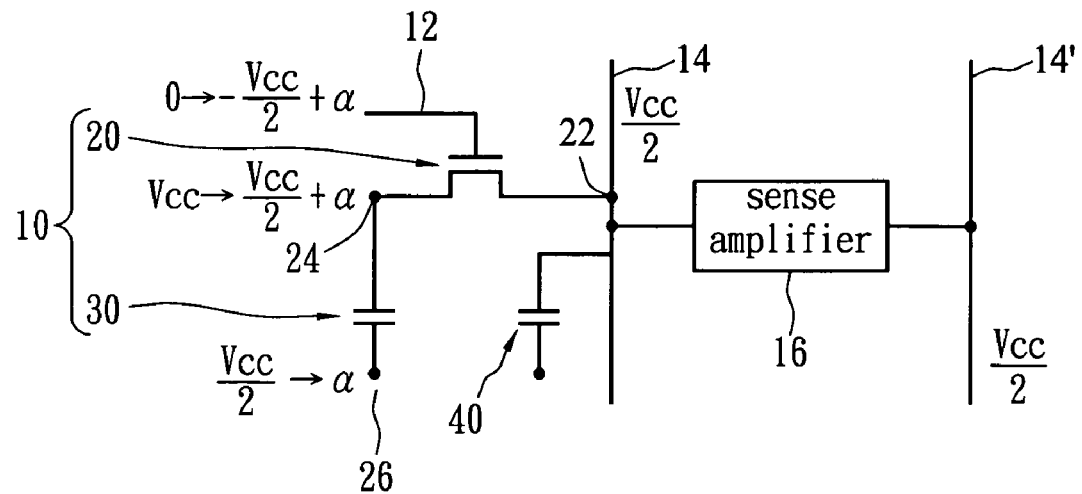
Figure 4:
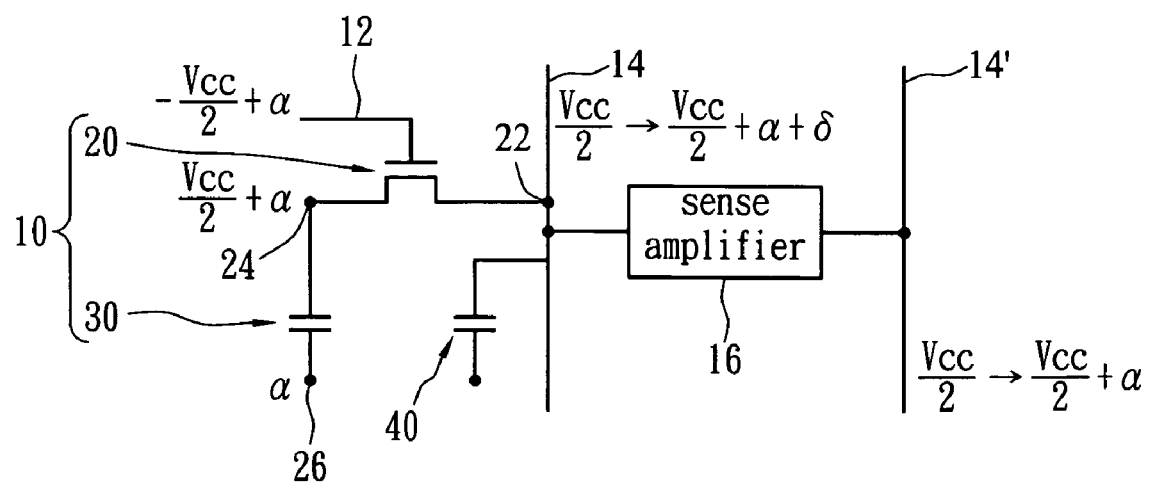

Referring to FIG. 3, the voltage of the word line 12 is lowered from zero to −Vcc/2+α to prevent the transistor 20 from turning on. The voltage of the cell plate 26 is then lowered to a first voltage, such as α, that approximates to zero. Because the transistor 20 remains in the off state, the storage node 24 is floating, and the voltage thereof drops to Vcc/2+α correspondingly. Subsequently, the voltage of the reference bit line 14' is raised from Vcc/2 to Vcc/2+α, that is, slightly higher than half of the supply voltage Vcc. The voltage of the bit line 14 is also raised from Vcc/2 to a second voltage, such as Vcc/2+α+δ, as shown in FIG. 4, the bottom limit of α is designed to prevent the transistor 20 from turning on. The value of δ is required to be large enough that the voltage difference between the bit line 14 and the reference bit line 14' is able to activate the sense amplifier 16 of the memory cell 10.

Figure 5:
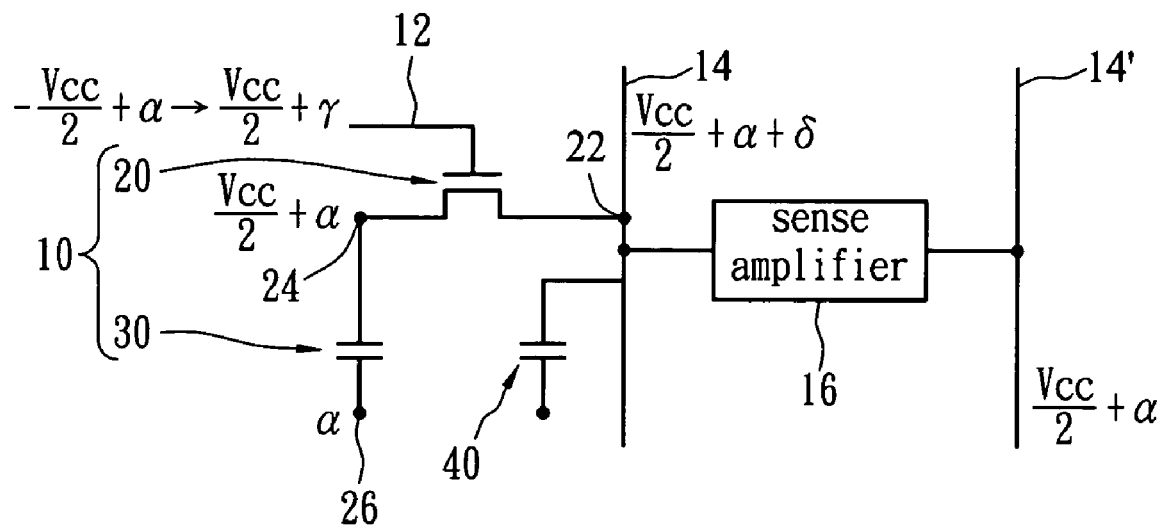

Referring to FIG. 5, the voltage of the word line 12 is then raised from −Vcc/2+α to a third voltage, such as Vcc/2+γ. As a result, the voltage difference between the word line 12 and the storage node 24 is γ−α, which is not sufficient to turn on the transistor 20. Therefore, no charge sharing occurs between the storage capacitor 30 and the parasite capacitor 40 of the bit line 14. Subsequently, the sense amplifier 16 senses the voltage difference between the bit line 14 and the reference bit line 14' to determine the data stored in the memory cell 10 to be 1.

Figure 6:
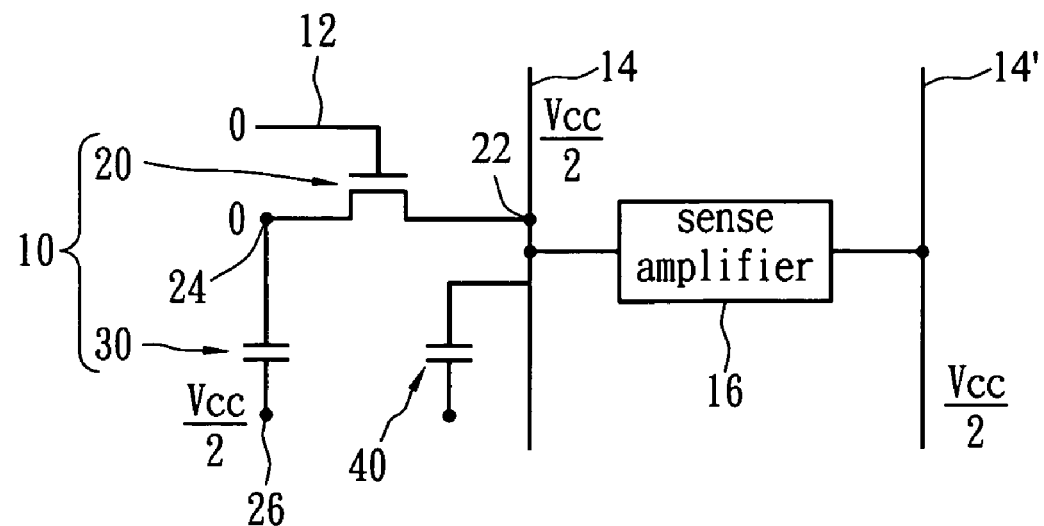
FIG. 6 to FIG. 9 illustrate a data sensing method for DRAM according to another embodiment of the present invention.

FIG. 6 to FIG. 9 illustrate a data sensing method for DRAM according to another embodiment of the present invention. The data stored on the memory cell 10 is 0. The voltage at the storage node 24 is zero, that is, the storage capacitor 30 is in the discharging state, and the voltage at the storage node 24 is in the low-level state. Referring to FIG. 6, when the memory cell 10 is ready to be read, the voltage of the bit line 14 and the cell plate 26 are kept at Vcc/2, and the voltage of the word line 12 is zero. The transistor 20 is in the off state.

Figure 7:
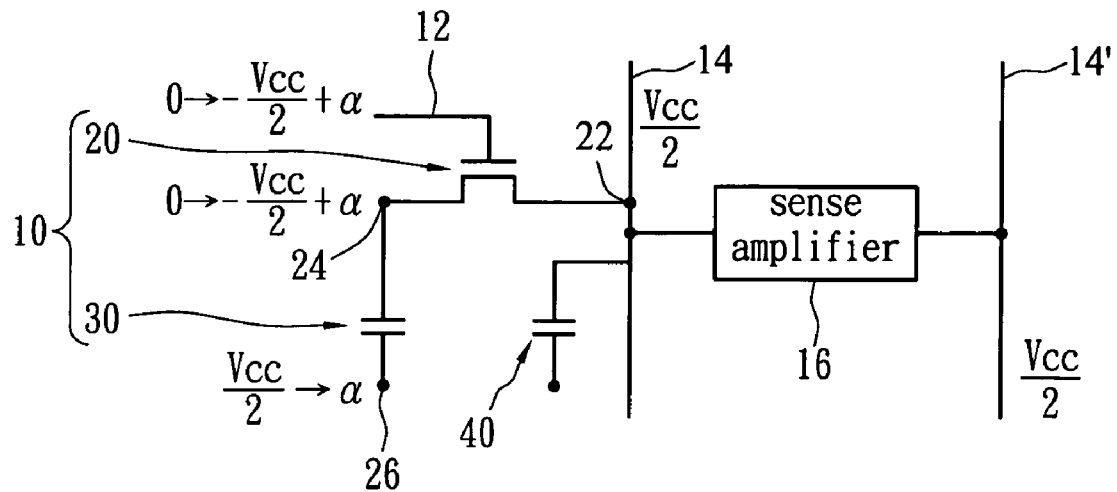

Referring to FIG. 7, the voltage of the word line 12 is lowered from zero to −Vcc/2+α to prevent the transistor 20 from turning on. The voltage of the cell plate 26 is then lowered to a first voltage, such as α, that approximates to zero. Because the transistor 20 remains in the off state, the storage node 24 is floating, and the voltage thereof drops to −Vcc/2+α.

Figure 8:
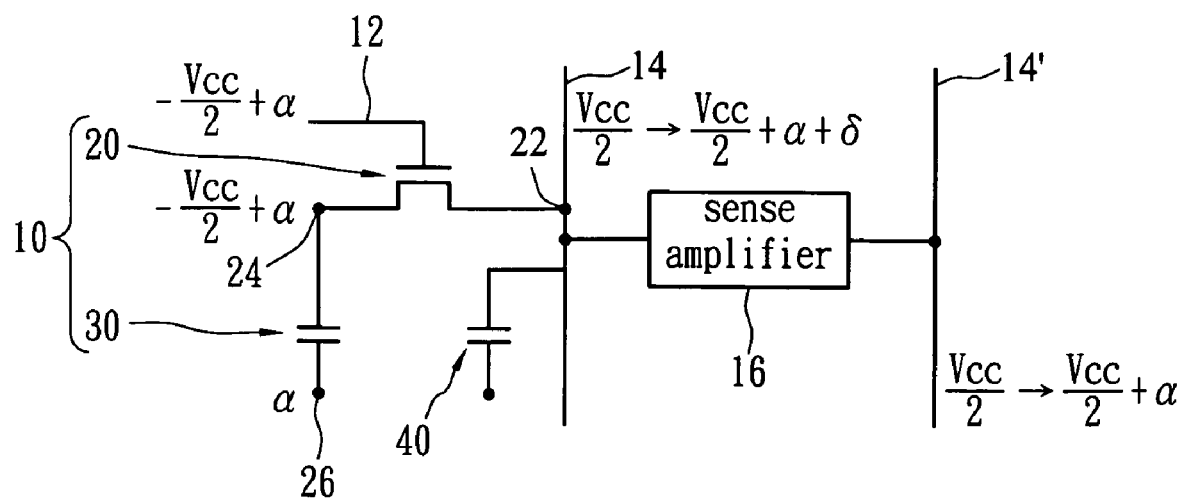

Referring to FIG. 8, the voltage of the reference bit line 14' is then raised to Vcc/2+α, that is, slightly higher than half of the supply voltage Vcc. The voltage of the bit line 14 is also raised from Vcc/2 to a second voltage, such as Vcc/2+α+δ. The value of δ is required to be large enough that the voltage difference between the bit line 14 and the reference bit line 14' is sufficient to activate the sense amplifier 16 of the memory cell 10.

Figure 9:
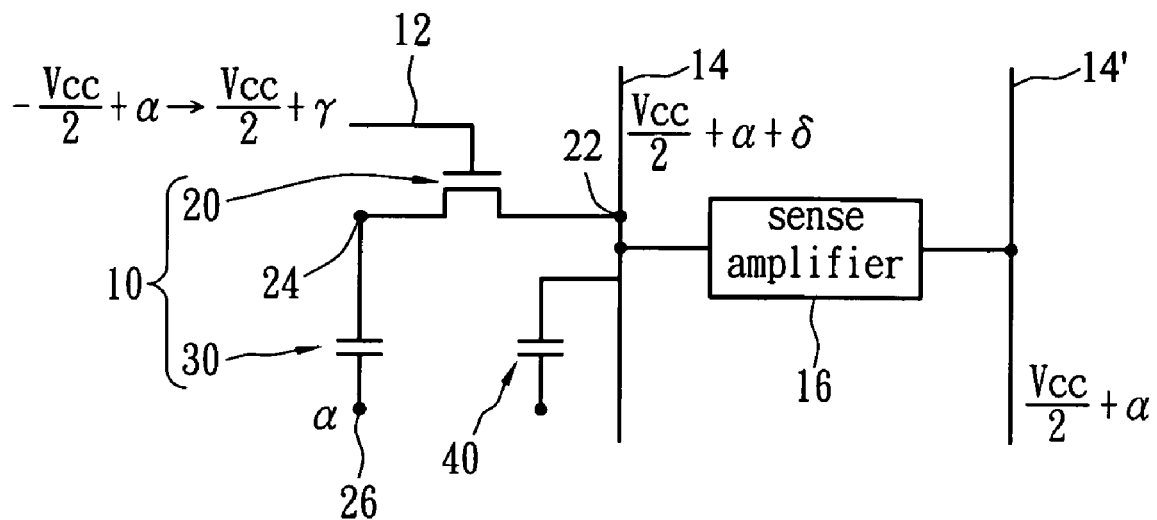

Referring to FIG. 9, the voltage of the word line 12 is then raised from −Vcc/2+α to a third voltage, such as Vcc/2+γ. As a result, the voltage difference between the word line 12 and the storage node 24 is Vcc+γ−α, which is large enough to turn on the transistor 20. Accordingly, a charge sharing process occurs between the storage capacitor 30 and the parasite capacitor 40 of the bit line 14, which results in reducing of the voltage of the bit line 14. Subsequently, the sense amplifier 16 is enabled to sense the voltage difference between the bit line 14 and the reference bit line 14' to determine the data stored in the memory cell 10 to be 0.

According to the description above, when the data stored on the memory cell 10 is 0, the voltage difference Vs of the bit line 14 after the charge sharing process can be represented as:

$$Vs' = \frac{Vcc + \delta}{\left(1 + \frac{Cb}{Cs}\right)}$$

Compared to the voltage difference Vs of the bit line 14 after the charge sharing process of the conventional data sensing method is:

$$Vs = \frac{1}{2} \frac{Vcc}{\left(1 + \frac{Cb}{Cs}\right)}$$

The sensing margin of the data sensing method according to the embodiments of the present invention is increased significantly.

Referring back to FIG. 4 and FIG. 8, the second voltage, to which the voltage of the bit line 14 is raised, is not limited to Vcc/2+α+δ but any value such that the voltage difference between the bit line 14 and the reference bit line 14' is large enough to activate the sense amplifier 16. Preferably, for the sense amplifier 16 to have better efficiency, the second voltage applied to the bit line 14 is adjusted from Vcc/2 to the best working range of the sense amplifier 16.

The data stored on the storage capacitor 30 of the memory cell 10 could be 1 or 0. The data sensing method according to one embodiment of the present invention is to keep the transistor 20 in the off state when the data stored on the storage capacitor 30 is a predetermined value (e.g. 1). On the other hand, when the data stored on the storage capacitor 30 is the opposite of the predetermined value (e.g. 0), the transistor 20 is turned on such that the charge sharing process occurs between the storage capacitor 30 and the parasite capacitor 40 of the bit line 14.

In brief, the conventional data sensing method for DRAM is to equally divide the sensing margin between the two states of the storage capacitor 30. The data sensing method according to the embodiments of the present invention, however, provides the sensing margin completely to one of the states for charge sharing. While in the other state, because the transistor 20 is in the off state, the bit line 14 will not be affected by those various noises. In other words, the sensing margin of the data sensing method according to the embodiments of the present invention is approximately twice as that of the conventional data sensing method.

Figure 10:
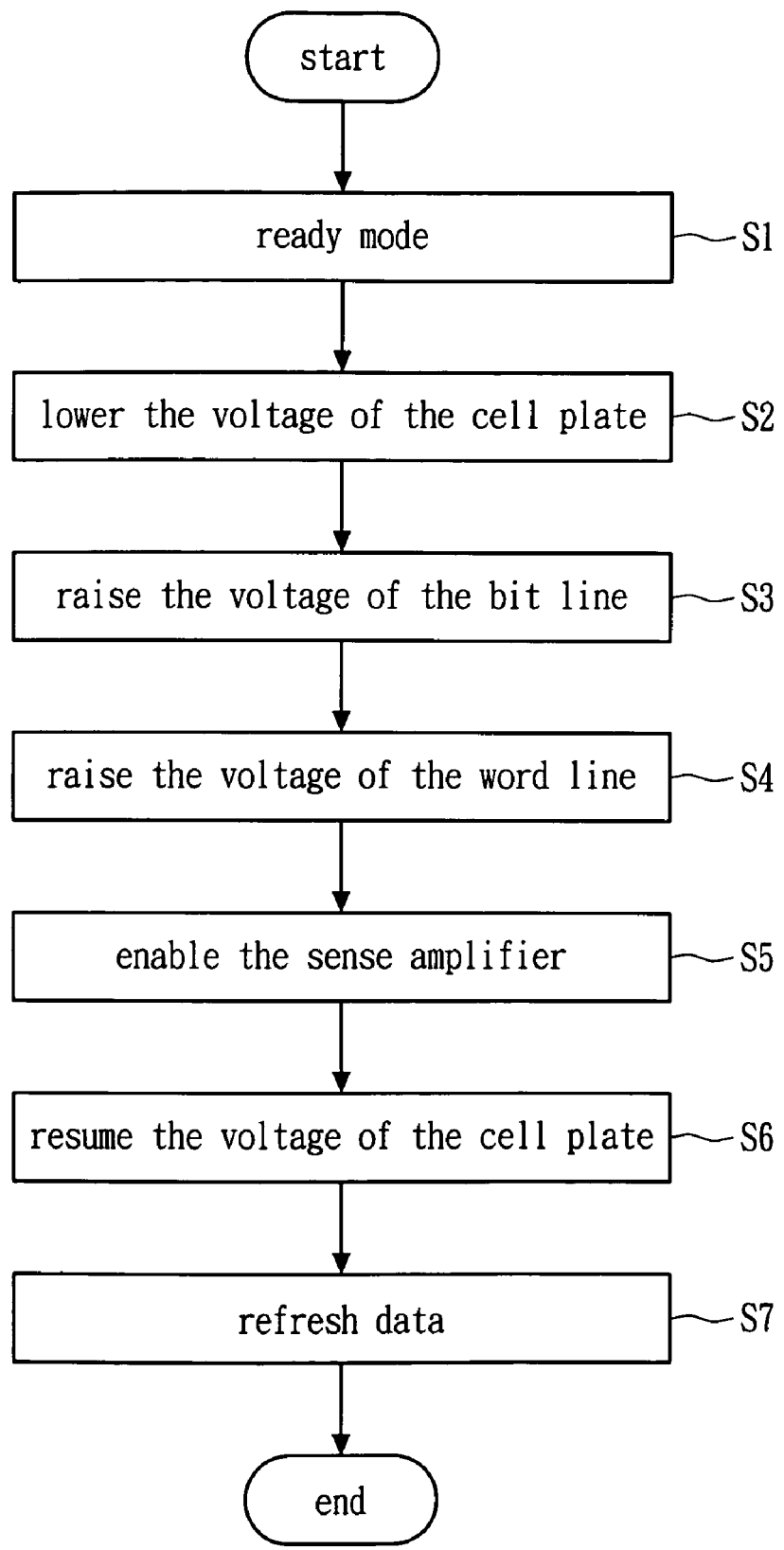
FIG. 10 illustrates the flow chart of a data sensing method for DRAM according to one embodiment of the present invention.

FIG. 10 illustrates the flow chart of a data sensing method for DRAM according to one embodiment of the present invention. In order for the data sensing method of the present invention to be compatible with the current DRAM system, the steps of the aforesaid embodiments can be expanded as shown in FIG. 10. In step S1, the memory cell 10 is set in a ready mode, as shown in FIGS. 2 and 6. Steps S2 to S4 correspond to FIG. 3 to 5 and FIG. 7 to 9, respectively. In step S5, the sense amplifier 16 is enabled to fix the voltages of the bit line 14 and the reference bit line 14' to zero or Vcc. In step S6, the voltage of the cell plate 26 is returned to Vcc/2. In step S7, the voltage of the word line 12 is raised to a high voltage Vpp for writing the voltage of the bit line 14 into the storage capacitor 30 such that the voltage of storage node 24 is zero or Vcc, that is, to refresh the data.

Figure 11:
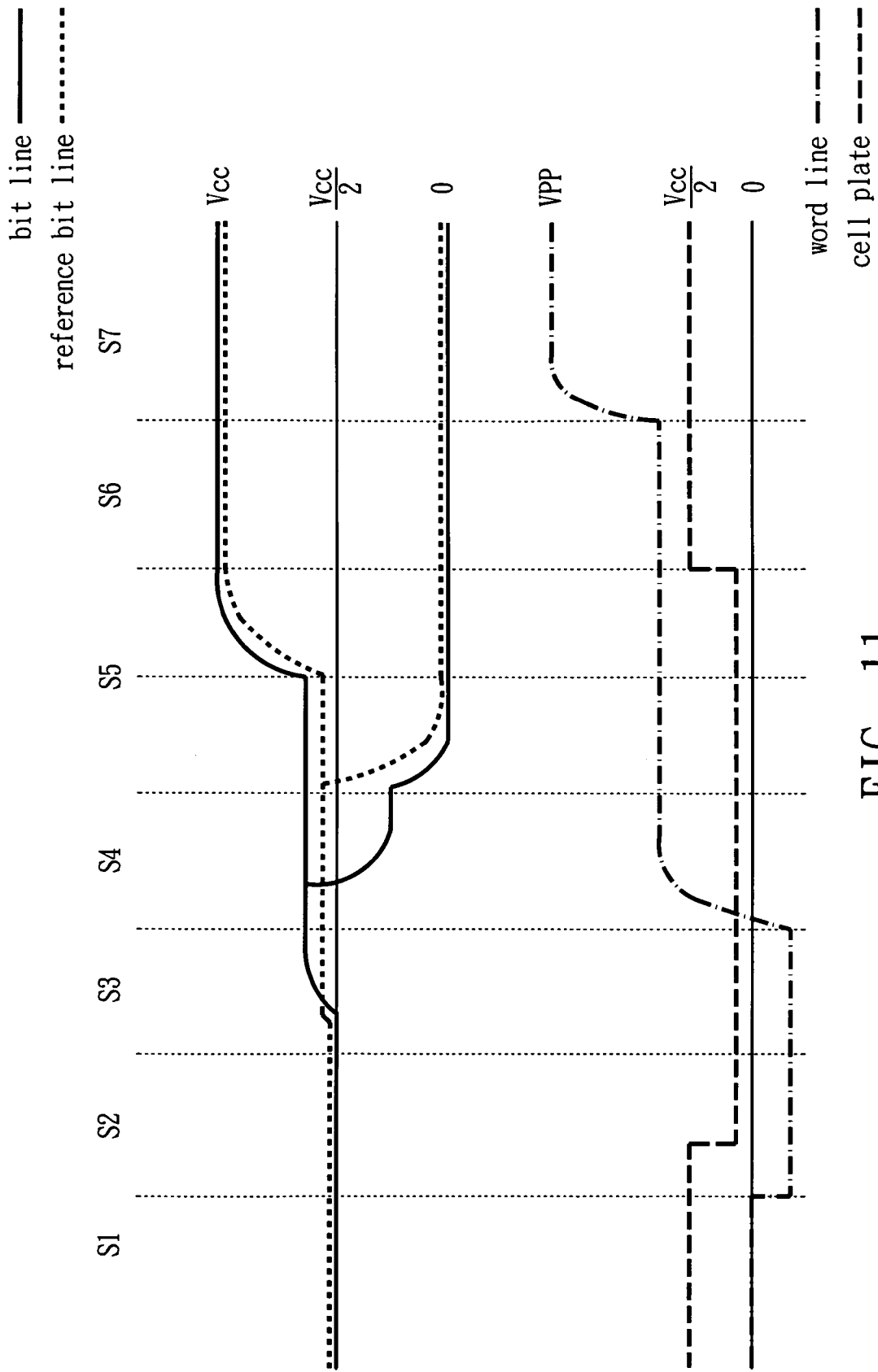
FIG. 11 illustrates the waveform of the voltage of the nodes of the DRAM cell according to the embodiments of the present invention.

FIG. 11 illustrates the waveform of the voltage of the nodes of the memory cell 10 when applying the data sensing method of aforesaid embodiments of the present invention. As shown in FIG. 11, during steps S1 and S2, the voltages of the bit line 14 and the reference bit line 14' are kept at Vcc/2. In step S3, the voltage of the bit line 14 is raised to Vcc/2+α, and the voltage of the reference bit line 14' is raised to Vcc/2+α+δ. In step S4, the charge sharing process occurs if the transistor 20 is turned on. Therefore, the voltage of the bit line 14 is not changed if the stored data is 1, and is changed to a lower value if the stored data is 0. Step S5 can be separated into two parts. In the first part, the sense amplifier 16 of the memory cell 10 pulls the voltages of the bit line 14 or the reference bit line 14' down to zero. In the second part, the sense amplifier 16 of the memory cell 10 pulls the higher voltage of the voltages of the bit line 14 and the reference bit line 14' up to Vcc.

The voltage of the word line 12 is zero in step S1. In step S2, the voltage of the word line 12 is pulled down to −Vcc/2+α to prevent the transistor 20 from turning on. In step S4, the voltage of the word line 12 is pulled up to Vcc/2+γ. In step S7, the voltage of the word line 12 is pulled up to Vpp such that the voltage of the bit line 14 is written into the memory cell 10. The voltage of the cell plate 26 is Vcc/2 in step S1, then pulled down to α in step S2, then pulled up to Vcc/2 at step S6, and holds at Vcc/2 voltage in step S7.

The voltage of the reference bit line 14' is fixed in the aforesaid embodiments, but it can also be adjusted by another charge sharing process. That is, the voltage of the reference bit line 14' can be adjusted to a non-specific value which ensures that the voltage of the bit line 14 is lower than that of the reference bit line 14' when the transistor 20 is turned on.

Figure 12:
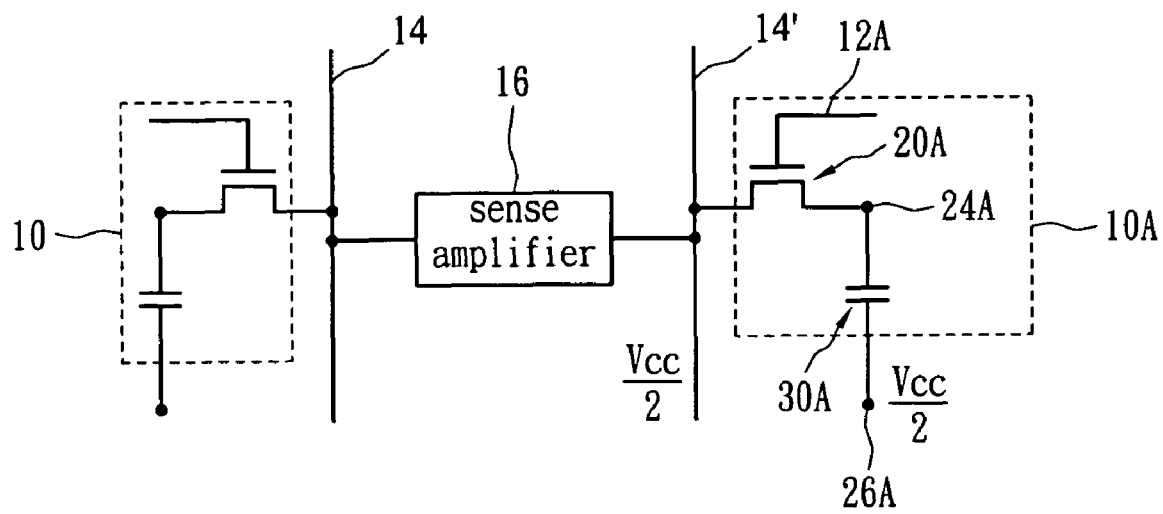
FIG. 12 to 15 illustrate a voltage adjusting method for the reference bit line of DRAM according to one embodiment of the present invention.

FIG. 12 to 15 illustrate a voltage adjusting method for the reference bit line of DRAM according to one embodiment of the present invention. As shown in FIG. 12, the DRAM containing the memory cell 10 further comprises a reference memory cell 10A for adjusting the voltage of the reference bit line 14'. The reference memory cell 10A comprises a reference storage capacitor 30A and a reference transistor 20A connecting the reference bit line 14' and the reference storage capacitor 30A. The reference transistor 20A is connected to the cell plate 26A of the memory cell 10A through the reference storage capacitor 30A and is controlled by a reference word line 12A. When the memory cell 10A is in a ready mode, the voltages of the reference bit line 14' and the cell plate 26A are kept at Vcc/2, while the voltage of the reference word line 12A is kept at zero.

Figure 13:
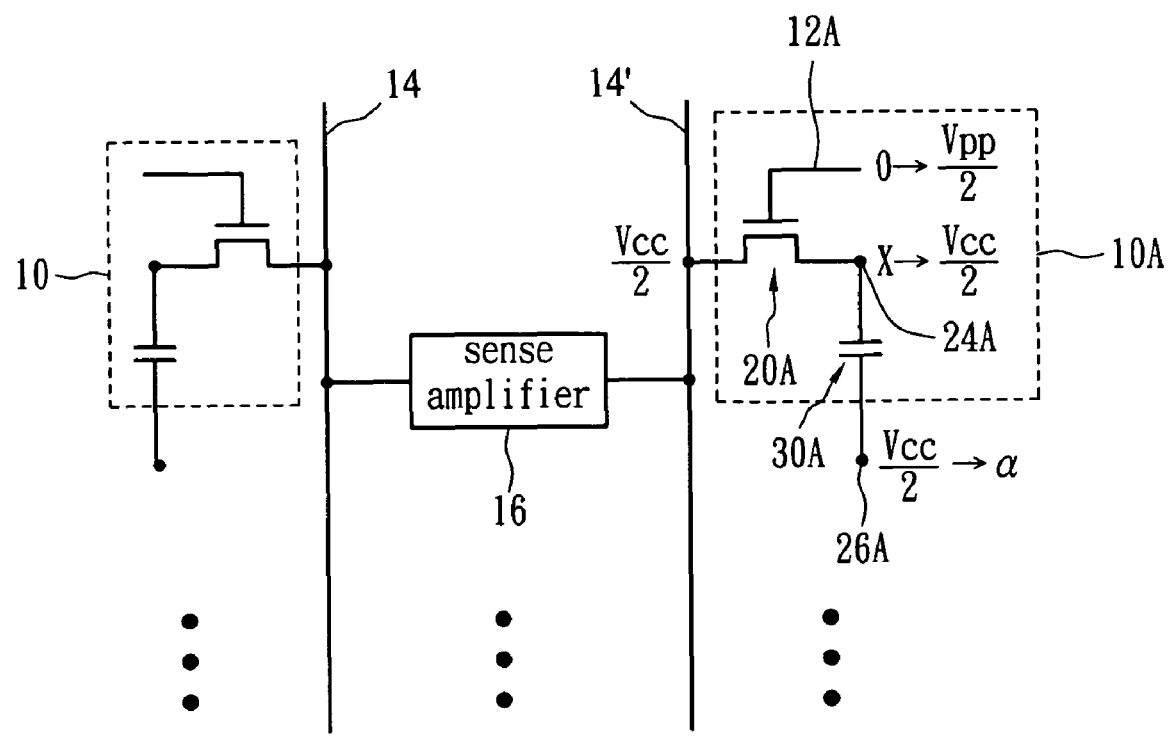
Figure 14:
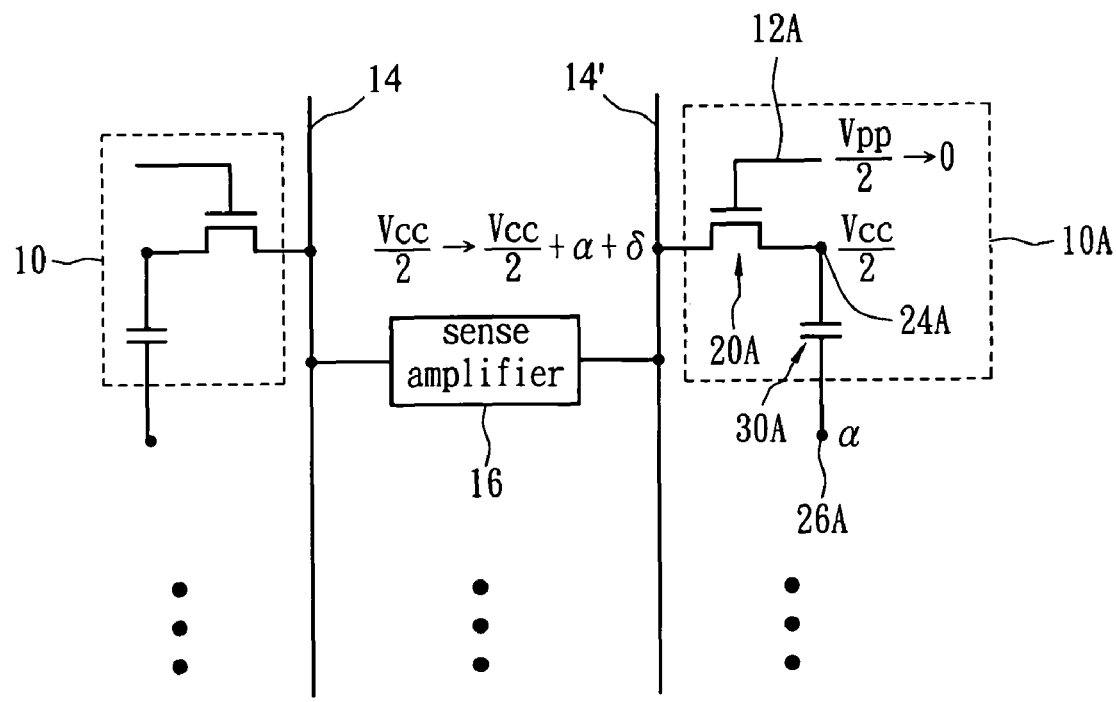

Referring to FIG. 13, the voltage of the cell plate 26A is lowered from Vcc/2 to a voltage α near zero. The voltage of the reference word line 12A is raised from zero to Vpp/2 to turn on the reference transistor 20A such that the reference transistor 20A is turned on and the voltage of the reference bit line 14' is written into the reference storage capacitor 30A. Therefore, the voltage of a storage node 24A equals that of the reference bit line 14', i.e., Vcc/2. Referring to FIG. 14, the voltage of the reference word line 12A is then lowered to zero to turn off the reference transistor 20A, and the voltage of the reference bit line 14' is raised to Vcc/2+α+δ in response to the bit line 14 of the memory cell 10.

Figure 15:
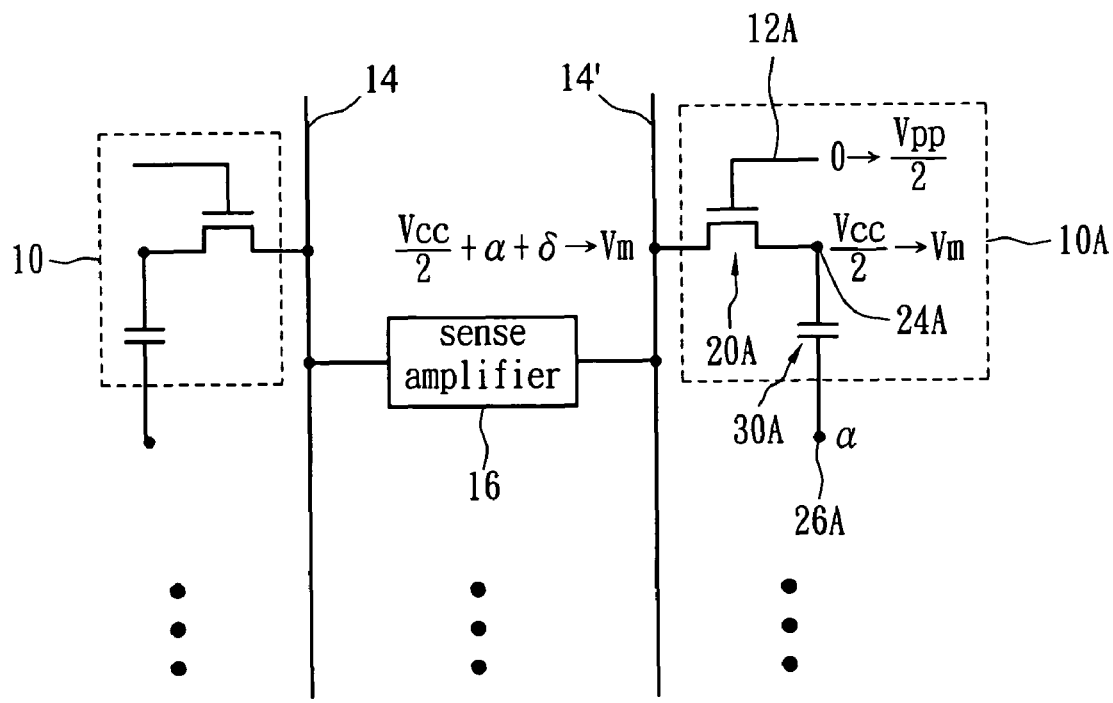

Referring to FIG. 15, the voltage of the reference word line 12A is raised from zero to Vpp/2 to turn on the reference transistor 20A such that a charge sharing process occurs between the storage capacitor 30A and the reference word line 12A. Consequently, the voltage of the storage node 24A changes from Vcc/2 to Vm, which can be represented as:

$$Vm = \frac{Vcc}{2} + (\alpha + \delta)\left(1 - \frac{1}{1 + \frac{Cb}{Cs}}\right)$$

The voltage difference of the reference bit line 14' Vq can be represented as:

$$Vq = \frac{\alpha + \delta}{\left(1 + \frac{Cb}{Cs}\right)}.$$

Therefore, when the data stored on the memory cell 10 is 0, the voltage difference (Vq) of the reference bit line 14' is smaller than the voltage difference (Vs') of the bit line 14, which can be represented as:

$$Vs' = \frac{Vcc + \delta}{\left(1 + \frac{Cb}{Cs}\right)}$$

The value of δ is required to be large enough that the voltage difference between the bit line 14 and the reference bit line 14' is able to activate the sense amplifier 16 of the memory cell 10 when the transistor 20 is in the off state.

Figure 16:
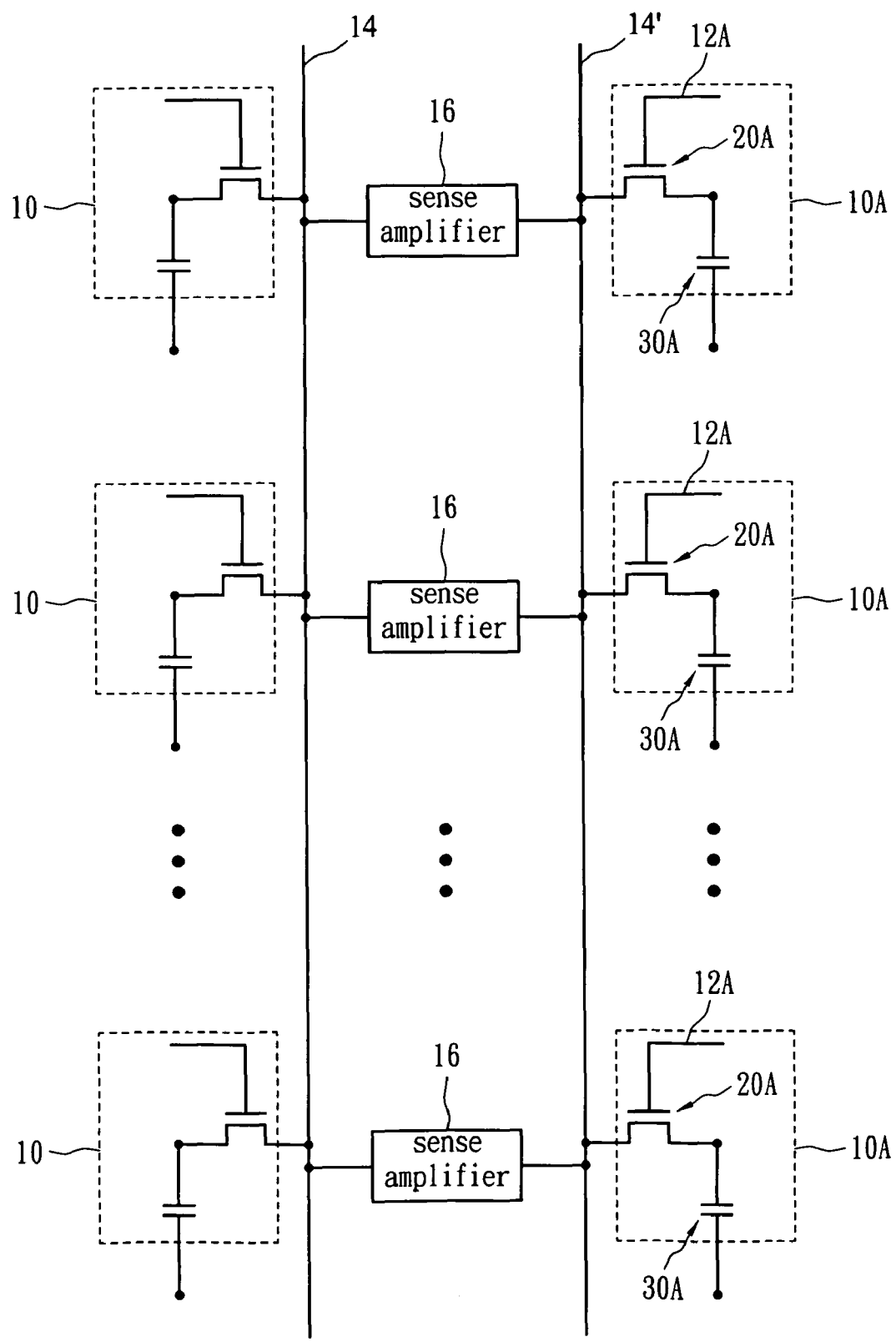
FIG. 16 illustrates a voltage adjusting method for the reference bit line of DRAM according to another embodiment of the present invention.

FIG. 16 illustrates a voltage adjusting method for the reference bit line of DRAM according to another embodiment of the present invention, which is an extension scheme of the voltage adjusting method shown in FIG. 12 to 15. As shown in FIG. 16, the extension scheme comprises a plurality of reference memory cells 10A. The charge sharing process between the storage capacitors 30A and the reference bit line 14' can be achieved by turning on different number of the reference transistors 20A so as to adjust the reference voltage of the reference bit line 14' flexibly.

Figure 17:
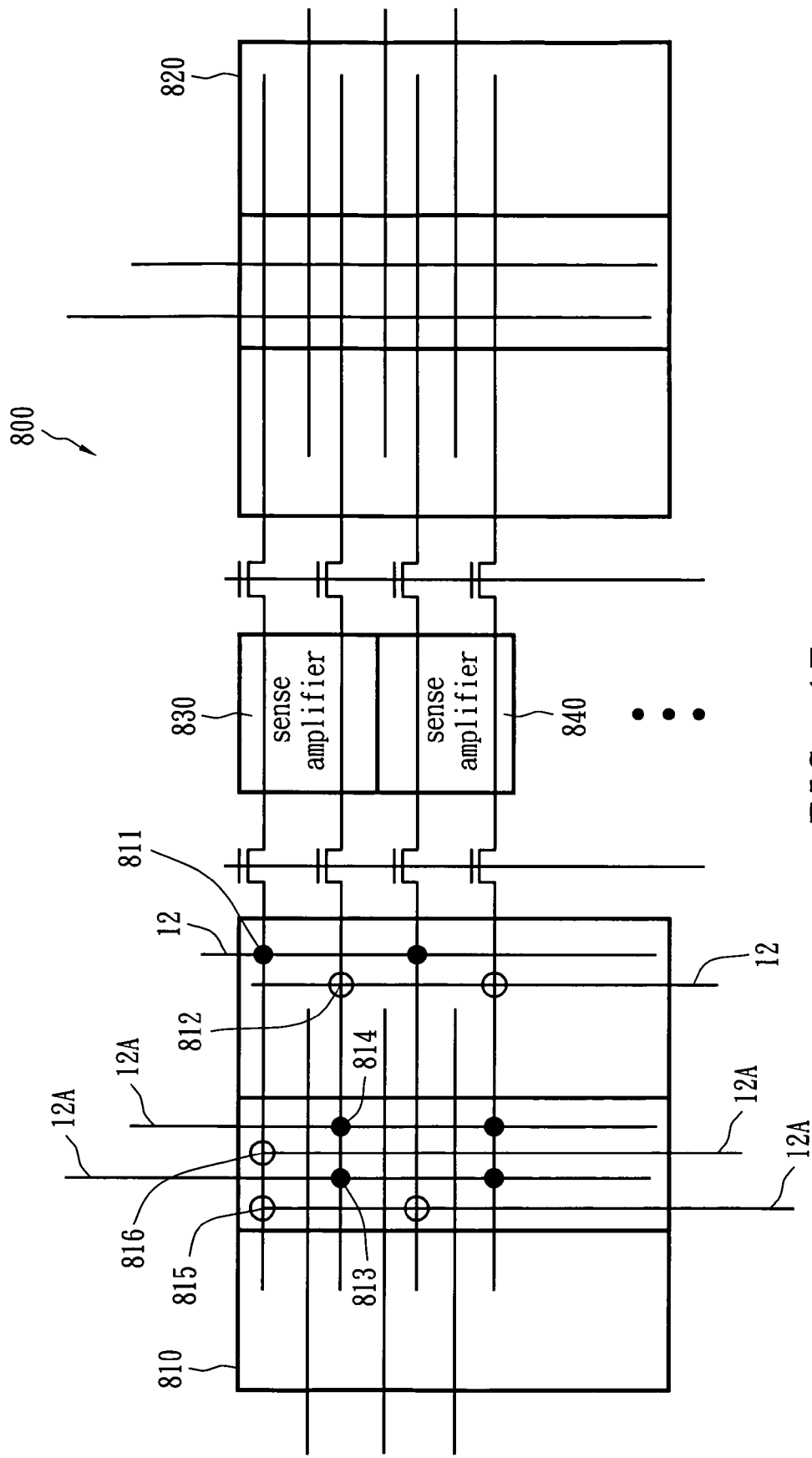
FIG. 17 illustrates a partial schematic view of DRAM with folded bit line structure to which the data sensing method of the present invention is applied.

FIG. 17 illustrates a partial schematic view of a DRAM 800 with folded bit line structure, to which the data sensing method of the present invention is applied. As shown in FIG. 17, the DRAM 800 comprises memory arrays 810 and 820 and sense amplifiers 830 and 840. The DRAM 800 adds two rows of reference memory cells for each memory array under the typical folded bit line DRAM structure. The memory array 810 comprises memory cells 811 and 812 and reference memory cells 813, 814, 815 and 816. The memory cell 811 corresponds to the reference memory cells 813 and 814, and the memory cell 812 corresponds to the reference memory cells 815 and 816.

Figure 18:
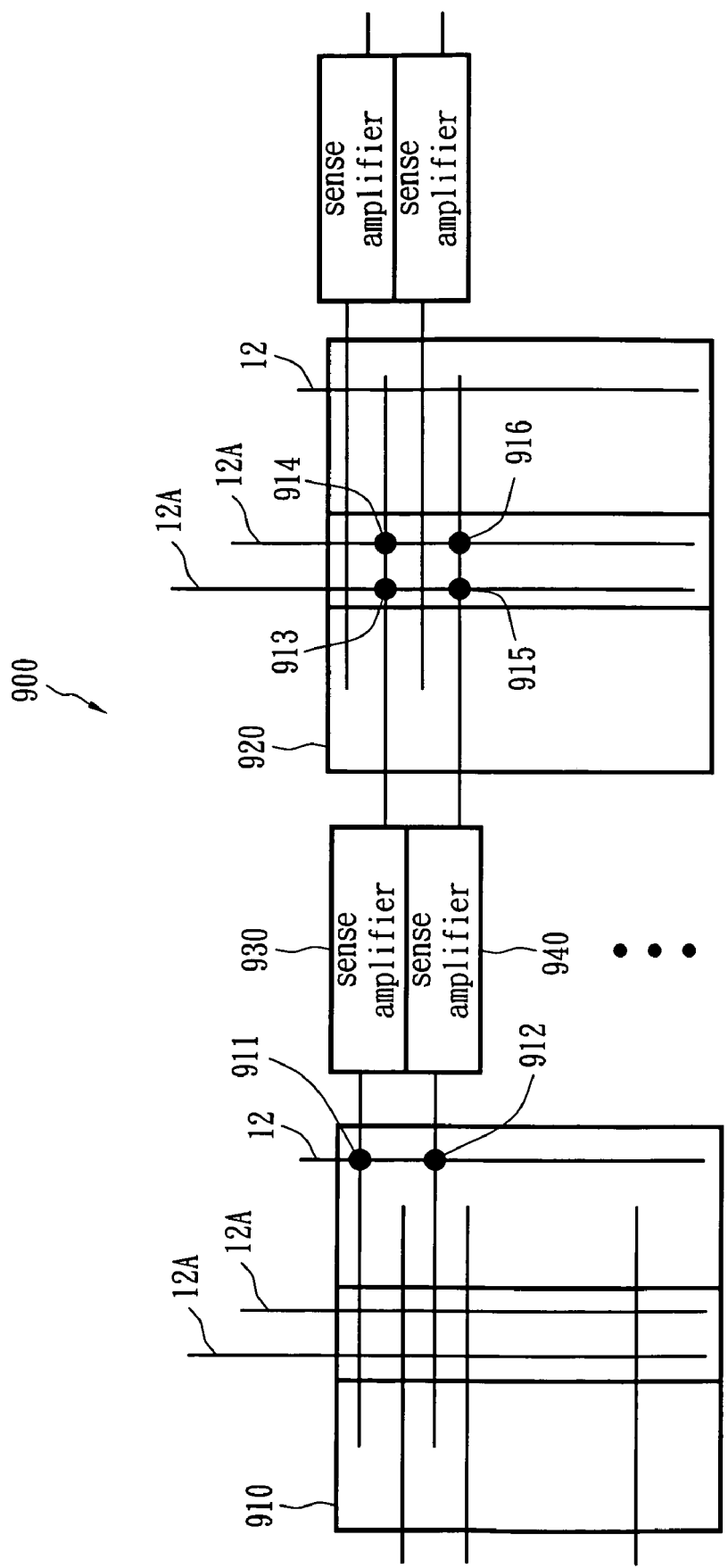
FIG. 18 illustrates a partial schematic view of a DRAM with open bit line structure to which the data sensing method of the present invention is applied.

FIG. 18 illustrates a partial schematic view of a DRAM 900 with open bit line structure, to which the data sensing method of the present invention is applied. As shown in FIG. 18, the DRAM 900 comprises memory arrays 910 and 920 and sense amplifiers 930 and 940. The DRAM 900 adds two rows of reference memory cells for each memory array under the typical open bit line DRAM structure. The memory array 910 comprises memory cells 911 and 912. The memory array 920 comprises reference memory cells 913, 914, 915 and 916. The memory cell 911 corresponds to the reference memory cells 913 and 914, and the memory cell 912 corresponds to the reference memory cells 915 and 916. It is appreciated that the added reference memory cells in FIGS. 17 and 18 are not limited to two rows but can be disposed as shown in FIG. 16 to adjust to the voltage of the reference bit line.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A data sensing method for a DRAM comprising a storage capacitor configured to store data, a bit line, a transistor connecting the storage capacitor and the bit line, a reference bit line and a sense amplifier connecting the bit line and the reference bit line, the data sensing method comprising the steps of:
   keeping the transistor in the off state when the stored data is a predetermined value and enabling the sense amplifier to sense the voltage of the bit line and the reference bit line; and
   turning on the transistor when the stored data is opposite to the predetermined value such that a charge sharing process occurs between the storage capacitor and a parasitic capacitor of the bit line and enabling the sense amplifier to sense the voltage of the bit line and the reference bit line.

2. The data sensing method of claim 1, wherein the storage capacitor is in a charging state or a high-level state when the stored data is the predetermined value.

3. The data sensing method of claim 1, wherein the storage capacitor is in a discharging state or a low-level state when the stored data is opposite to the predetermined value.

4. The data sensing method of claim 1, wherein when the stored data is the predetermined value, no charge sharing process occurs between the storage capacitor and the parasitic capacitor of the bit line.

5. The data sensing method of claim 1, wherein the predetermined value is 1, and the opposite of the predetermined value is 0.

6. The data sensing method of claim 1, wherein the predetermined value is 0, and the opposite of the predetermined value is 1.

7. A data sensing method for a DRAM comprising a storage capacitor, a transistor connected to one terminal of the storage capacitor, a word line configured to control the transistor, a bit line connected to the transistor and a cell plate connected to another terminal of the storage capacitor, the data sensing method comprising the steps of:
   lowering the voltage of the cell plate to a first voltage and lowering the voltage of the word line correspondingly to keep the transistor in an off state;
   raising the voltage of the bit line to a second voltage;
   raising the voltage of the word line to a third voltage, wherein the third voltage cannot turn on the transistor if the voltage of the storage capacitor is in a high-level state; and
   enabling a sense amplifier of the DRAM.

8. The data sensing method of claim 7, wherein the first voltage is approximately zero volt.

9. The data sensing method of claim 7, wherein the second voltage is in the best working range of the sense amplifier.

10. The data sensing method of claim 7, wherein the second voltage is slightly higher than half of the supply voltage of the DRAM.

11. The data sensing method of claim 7, wherein if the voltage of the storage capacitor is in a low-level state, the third voltage turns on the transistor such that a charge sharing process occurs between the storage capacitor and a parasitic capacitor of the bit line.

12. The data sensing method of claim 7, further comprising the steps of:
   resuming the voltage of the cell plate back to the voltage before the data sensing method started; and
   raising the voltage of the word line to a high voltage to turn on the transistor.

13. The data sensing method of claim 7, wherein the voltage of a reference bit line of the DRAM is adjustable.

14. The data sensing method of claim 7, wherein the voltage of a reference bit line of the DRAM cell is controlled by a plurality of reference memory cells.

15. The data sensing method of claim 7, wherein the DRAM is in a ready mode and the transistor is in the off state before the data sensing method starts.

16. The data sensing method of claim 15, wherein when the DRAM is in the ready mode, the voltage of the word line is approximately zero volts.

17. The data sensing method of claim 15, wherein when the DRAM is in the ready mode, the voltage of the bit line is half of the supply voltage of the DRAM.

18. The data sensing method of claim 15, wherein when the DRAM is in the ready mode, the voltage of the cell plate is half of the supply voltage of the DRAM.

19. The data sensing method of claim 7, being applied to a DRAM with folded bit line structure.

20. The data sensing method of claim 7, being applied to a DRAM with open bit line structure.

* * * * *